United States Patent
Yang et al.

(10) Patent No.: US 11,037,816 B2
(45) Date of Patent: Jun. 15, 2021

(54) TRANSISTOR DEVICE WITH SINKER CONTACTS AND METHODS FOR MANUFACTURING THE SAME

(71) Applicant: Texas Instruments Incorporated, Dallas, TX (US)

(72) Inventors: Hong Yang, Richardson, TX (US); Michael F Chisholm, Garland, TX (US); Yufei Xiong, Chengdu (CN); Yunlong Liu, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 346 days.

(21) Appl. No.: 15/649,774

(22) Filed: Jul. 14, 2017

(65) Prior Publication Data
US 2018/0261495 A1 Sep. 13, 2018

Related U.S. Application Data

(63) Continuation of application No. PCT/CN2017/076387, filed on Mar. 13, 2017.

(51) Int. Cl.
  *H01L 21/762* (2006.01)
  *C23C 16/30* (2006.01)

(52) U.S. Cl.
  CPC .. *H01L 21/76237* (2013.01); *H01L 21/76232* (2013.01); *C23C 16/306* (2013.01)

(58) Field of Classification Search
  None
  See application file for complete search history.

(56) References Cited

U.S. PATENT DOCUMENTS

| | | | |
|---|---|---|---|
| 9,397,180 B1* | 7/2016 | Yang | H01L 29/41708 |
| 2009/0166733 A1* | 7/2009 | Lee | H01L 29/7813 |
| | | | 257/330 |
| 2011/0068475 A1* | 3/2011 | de Fresart | H01L 21/76876 |
| | | | 257/774 |
| 2011/0266620 A1* | 11/2011 | Terrill | H01L 21/743 |
| | | | 257/343 |
| 2012/0146188 A1* | 6/2012 | Chen | H01L 29/66174 |
| | | | 257/596 |
| 2013/0113104 A1* | 5/2013 | Qian | H01L 21/76202 |
| | | | 257/751 |
| 2016/0315159 A1* | 10/2016 | Yang | H01L 29/41708 |

OTHER PUBLICATIONS

Yufei Xiong et al., U.S. Appl. No. 15/342,896, "Power MOSFET with Metal Filled Deep Sinker Contact for CSP" filed Nov. 3, 2016.

* cited by examiner

*Primary Examiner* — Seahvosh Nikmanesh
(74) *Attorney, Agent, or Firm* — Jacqueline J. Garner; Charles A. Brill; Frank D. Cimino

(57) ABSTRACT

In described examples, a device includes a semiconductor substrate; a buried layer; and a trench with inner walls extending from the buried layer to a surface of the semiconductor substrate, the trench having sidewalls, a bottom wall, a barrier layer including a titanium (Ti) layer covering the sidewalls and the bottom wall, and a filler including more than one layer of conductor material formed on the barrier layer.

17 Claims, 10 Drawing Sheets

TRANSISTOR DEVICE WITH SINKER CONTACTS AND METHODS FOR MANUFACTURING THE SAME

TECHNICAL FIELD

The present disclosure relates generally to integrated circuit manufacturing, and more particularly to formation of low resistance contacts including sinker contacts in an integrated circuit.

BACKGROUND

High power transistors frequently occupy a major portion of the chip area in a high power integrated circuit. Vertical high power devices occupy much less area than horizontal high power devices but maintains a low resistance path to conduct currents from a low resistance buried layer, such as a buried drain region of a MOS transistor or a buried collector region of a bipolar transistor, to a contact pad on a surface of an integrated circuit or a semiconductor wafer. Typically, the low resistance path can be formed by etching a deep contact opening from the surface of the substrate vertically to a buried layer, which can be a buried drain region or a buried collector region within the substrate. The deep contact opening is then filled with low resistance metal such as chemical vapor deposited tungsten (CVD-W). CVD-W deposition is used because the low resistance paths typically have a high aspect ratio, and CVD-W has excellent step coverage. However, a thick deposition layer induces wafer stress which can warp the wafer, and which can impact subsequent steps in the semiconductor fabrication process.

SUMMARY

In a described example, a device includes a semiconductor substrate; a buried layer; and a trench with inner walls extending from the buried layer to a surface of the semiconductor substrate, the trench having sidewalls, a bottom wall, a barrier layer including a titanium (Ti) layer covering the sidewalls and the bottom wall, and a filler including more than one layer of conductor material formed on the barrier layer.

BRIEF DESCRIPTION OF THE DRAWINGS

FIGS. 5AA through 5EE are close up view cross sections of the upper portion of a contact illustrating the steps in the formation of a contact using an embodiment process.

DETAILED DESCRIPTION OF EXAMPLE EMBODIMENTS

Corresponding numerals and symbols in the different figures generally refer to corresponding parts unless otherwise indicated. The figures are not necessarily drawn to scale.

Vertical contacts (sometimes referred to as sinker contacts) are typically used to provide a low resistance path between a contact pad on the surface of a semiconductor substrate and a buried layer formed within the substrate, such as a buried drain or buried collector of a MOS transistor or bipolar transistor. The contact can be circular or oval, or can be a rectangular trench. Earlier vertical contacts to buried layers were formed of a chain of highly doped regions to form a vertical conductive path from the surface to the buried portion, or in another approach a contact opening was formed and was then filled with doped polysilicon. These approaches resulted in a relatively high resistance in the contact.

Figure 1:
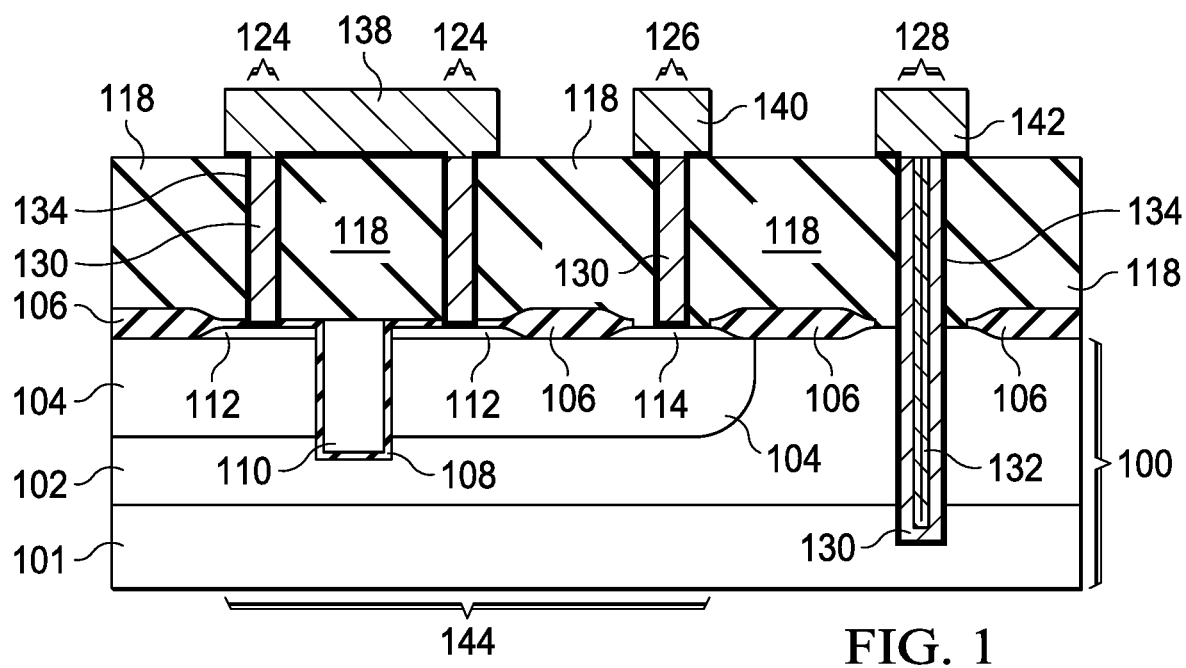
FIG. 1 is a cross section of a device with a contact.

An example of a semiconductor device with a vertical NMOS transistor including a low resistance contact is shown in cross section in FIG. 1. Substrate 100 includes a lightly doped, n-type epitaxial layer 102 on a buried diffusion layer 101. Typically the buried layer 101 is more highly doped than the overlying n-type epitaxial layer 102 to additionally reduce the resistance of the buried drain or buried collector. In an example, the buried layer 101 is formed by diffusion. Low resistance contact 128 is formed in a trench that extends through the pre-metal dielectric layer 118, through the lightly doped n-type epitaxial layer 102, and into the buried layer 101. The low resistance contact 128 is filled with deposited conductor layers 130 and 132. In an example, the deposited conductor layers are chemical vapor deposited tungsten (CVD-W) layers. The low resistance contact 128 forms electrical contact along the portion of walls and the bottom of the contact 128 that extend through the n-type epitaxial layer 102 and into the buried layer 101. Contact 128 is low resistance compared to other contact types, because the tungsten in the contact forms a low resistance path when compared to doped silicon or doped polysilicon. The contact 128 can be a trench. The contact 128 can be formed in a rectangular, round, oval or square shape. The contact 128 can be referred to as a sinker contact because it makes a vertical contact to a buried layer in a substrate.

To illustrate the benefits of the low resistance contact 128, a vertical NMOS transistor 144 is used. Other transistors such as a vertical PMOS transistors, or discrete high power bipolar transistors such as a vertical NPN or a vertical PNP bipolar transistor can also be used. In addition the transistors may be discrete devices or can be part of an integrated circuit that includes additional devices on a monolithic device. The source of the vertical NMOS transistor 144 is n-type diffusion 112. The body of the vertical NMOS transistor 144 is a p-well 104. The drain of the vertical NMOS transistor 144 is the n-type epitaxial layer 102 plus buried layer 101. Gate dielectric 108 isolates the polysilicon transistor gate 110, from the source 112, the drain 102, and the body 104 of the vertical r NMOS transistor 144. A dielectric isolation 106 such as LOCOS (local oxidation of silicon) or STI (shallow trench isolation—not shown in FIG. 1) electrically isolates the vertical NMOS transistor 144 from the low resistance contact 128.

The body 104 is connected by contact plug 126 to interconnect lead 140. The contact plug 126 is connected to the p-type body 104 through a heavily doped p-type diffusion 114. The n-type source diffusions 112 are connected by contact plugs 124 to interconnect lead 138. The contact holes are etched through pre-metal dielectric (PMD) layer 118, and are typically lined with a barrier material 134 such as titanium plus titanium nitride prior to being filled with a conductor material. In an example, CVD-W (chemical vapor deposited tungsten) is used as the conductor material.

When voltage is applied to the transistor gate 110, a channel forms in the body 104 under the gate dielectric 108 and high current flows through the vertical NMOS transistor 144 and into the low resistance buried diffusion layer 101. According to Ohm's Law, I=V/R (current=voltage/resistance), so that current increases as resistance, R, is reduced. The low resistance contact 128 includes a trench that extends from the first layer of interconnect 142 through the PMD layer 118; through the lightly doped, n-type epitaxial layer 102; and into the more heavily doped buried layer 101. This significantly reduces the contact resistance in series with the buried layer 101, which in this example is the drain of the transistor 144. In contrast to a conductive path to the substrate surface from the buried layer formed using a prior combination of doped silicon diffusions or of a doped polysilicon, the contact 128 provides lowered resistance. The lowered resistance results in a significant increase in the high power (high current) performance of the transistor 144.

FIG. 1 shows conductor filled contacts 124 and 126 and CVD-W filled contact 128. The contact 128 can be in the form of a trench, or in alternative arrangements, the contact 128 can be a round or oval shaped opening. The contact 128 can be referred to as a sinker contact as it forms a low resistance vertical contact to a buried layer. In an example process, the contacts 124, 126 and 128 are filled using chemical vapor deposition to deposit tungsten (CVD-W). In this illustrative example contacts 124 and 126 are smaller than contact 128. These two contacts are shown completely filled by the first deposited CVD-W layer 130. The larger contact 128 is shown partially filled with the first deposited CVD-W layer 130, and then completely filled with a second deposited CVD-W layer 132. Depending on the diameter of contacts 124 and 126 and the thickness of the first CVD-W layer 130, contacts 124 and 126 may not fill completely with the first deposited CVD-W film 130 and can also contain some of the second deposited CVD-W layer 132.

Deposited CVD-W films with a thickness greater than about 700 nm have high stress that can cause wafer warpage, resulting in problems during subsequent wafer processing steps. For example, wafer warpage caused by high stress of the deposited CVD-W layer can cause a reduction in depth of focus during a photolithography step, or may cause increased wafer breakage during a chemical mechanical polishing (CMP) step.

A contact that is larger than 0.8 um in diameter requires deposition of CVD-W layer with a thickness of more than 700 nm to fill it. The stress of a greater than 700 nm thick film can cause wafer warpage and subsequent processing problems. In the embodiments, by dividing the deposition of the CVD-W layer into at least two depositions with less than about 700 nm thickness, and by etching back the CVD-W layer after the depositions to remove the CVD-W from the surface of the semiconductor wafer, the stress on the wafer may be greatly reduced. For example, a first half micron thick CVD-W film 130 can be deposited forming a half micron layer of CVD-W on the surface of the semiconductor wafer. The first CVD-W layer is then etched back to clear the CVD-W layer from the surface of the wafer while leaving it on the sidewalls of the contacts and the sidewalls of contact 128. A second half micron thick CVD-W film 132 may then deposited forming a half micron layer of CVD-W on the surface of the semiconductor wafer 100 and completely filling the contact 128. This second CVD-W layer 132 is then etched back to clear the second CVD-W layer 132 from the surface of the semiconductor wafer 100. Unlike an example single deposition CVD-W contact fill process which deposits a one micron thick CVD-W layer on the semiconductor wafer 100, the embodiment two-step process limits the deposited CVD-W layer thickness on the surface of the semiconductor wafer to a half micron or less. In alternative embodiments, the conductor can be a material other than tungsten. In still further embodiments, another deposition process can be used. The step coverage of the process needs to cover the bottom and sidewalls of the trench or opening of the contact 128 in the first deposition, and subsequent depositions can then be used to fill the contact. More than two depositions can be performed to fill the contact 128.

FIGS. 2A-2C and FIG. 3 illustrate the formation of a defect that may occur when the underlying titanium layer 136 of the barrier layer is undesirably exposed during the etch back of the first CVD-W layer 130.

Figure 2A:
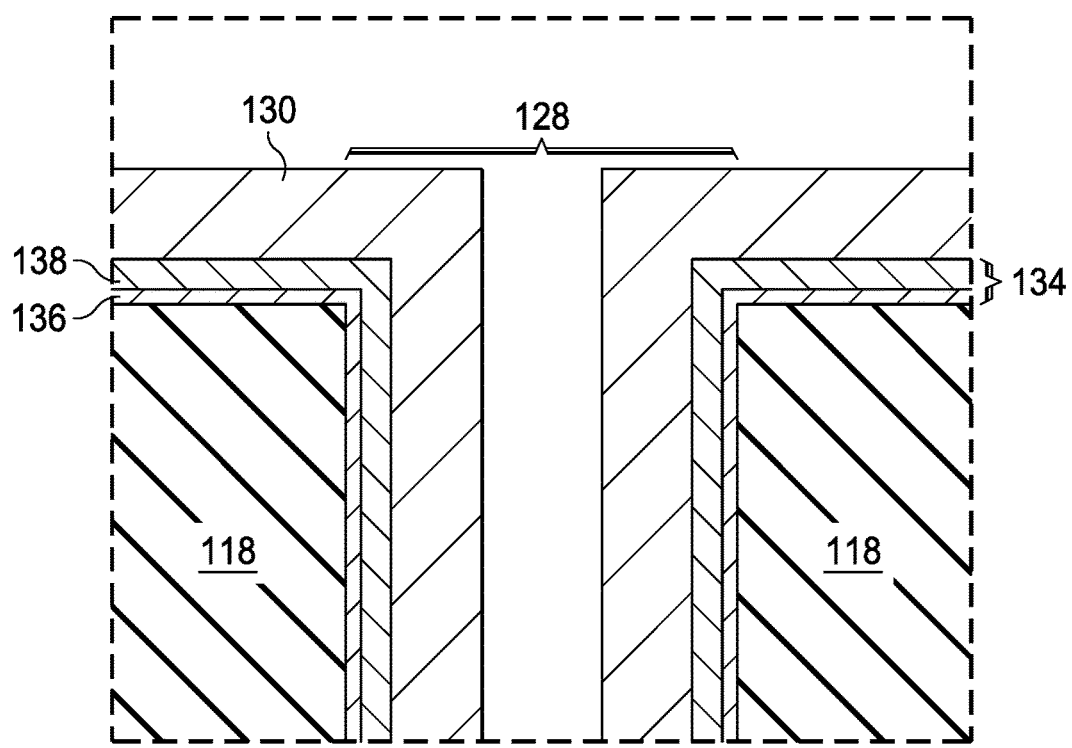
FIGS. 2A through 2C are cross sections illustrating the formation of a volcano defect on a portion of a contact.

FIG. 2A shows in a close up cross section the first CVD-W layer 130 deposited on a barrier layer 134 that includes a TiN layer 138 deposited on a Ti layer 136. The barrier layer 134 covers the horizontal surface of the PMD layer 118 and the sidewalls of the contact 128. The TiN layer 138 portion of the barrier layer 134 prevents gaseous fluorine generated from tungsten hexafluoride gas during the CVD-W deposition from attacking Ti layer 136 below TiN layer 138. The Ti layer 136 portion of the barrier layer 134 ensures good adhesion of the TiN layer 138 to the PMD layer 118, and also lowers contact resistance.

Figure 2B:
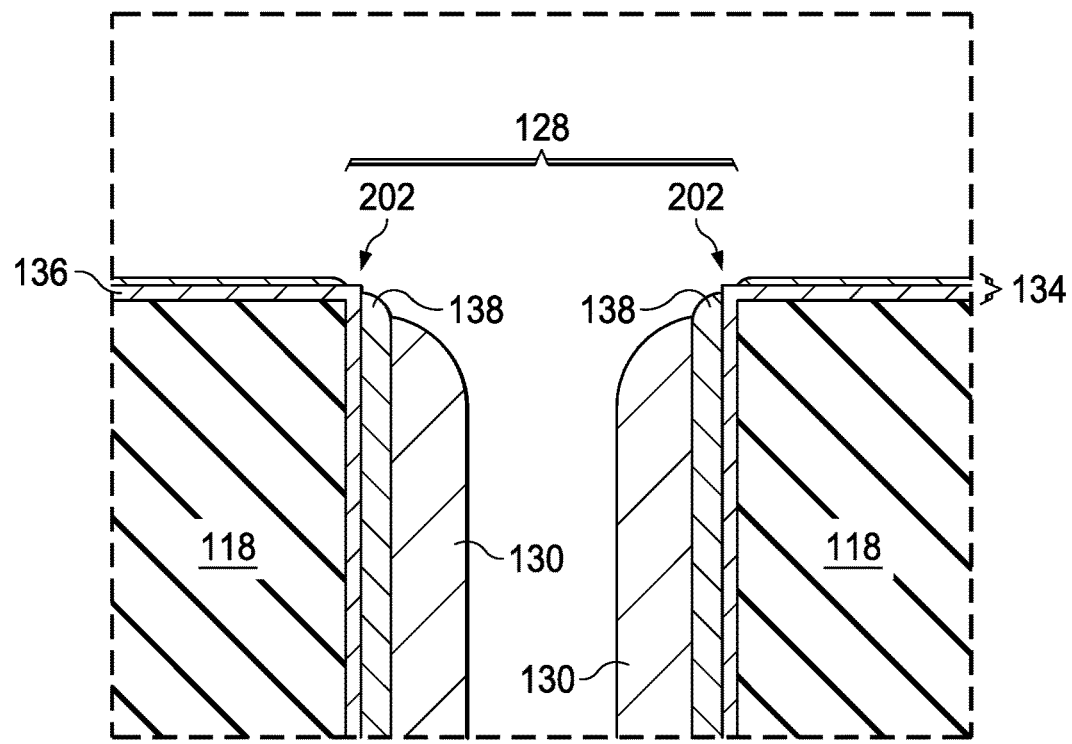

FIG. 2B shows in another cross section that during the etch back of the first CVD-W layer 130 following the deposition (see FIG. 2A). As shown in FIG. 2B, a portion of the TiN barrier layer 138 may be etched away, therefore exposing some of the underlying Ti layer 202. This can occur when the thickness of the first CVD-W layer 130 is non-uniform across the wafer, when the etch back rate of the tungsten plasma etch is non uniform across the wafer, or when the etch back time of the first CVD-W layer 130 is too long.

Figure 2C:
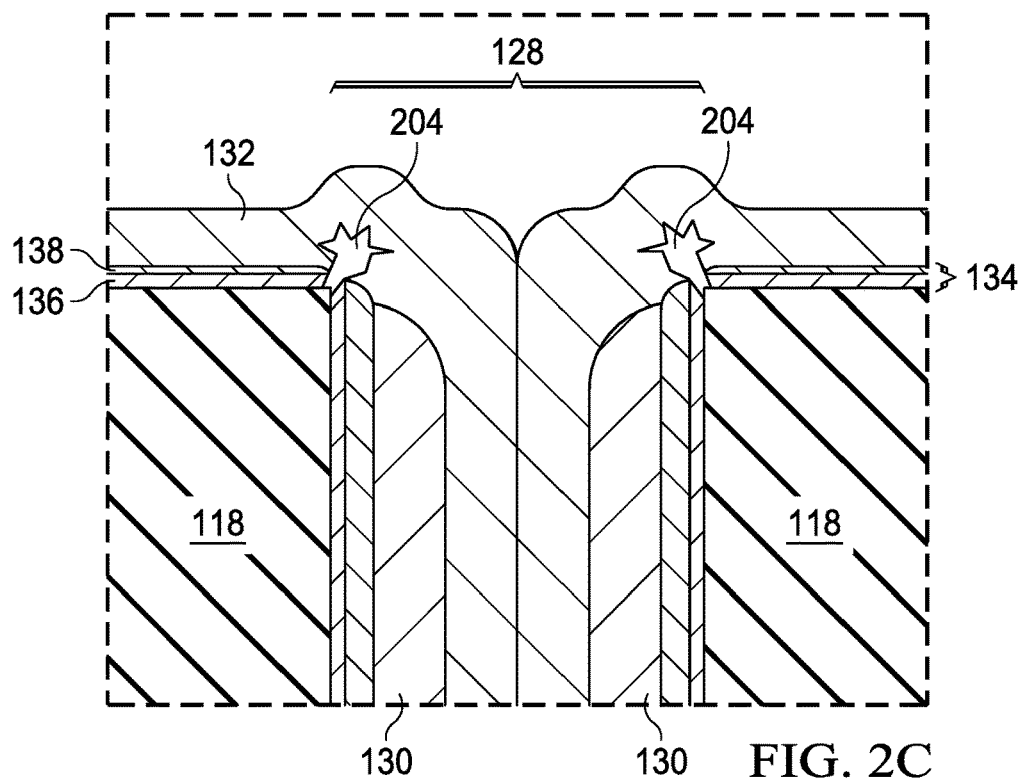
Figure 3:
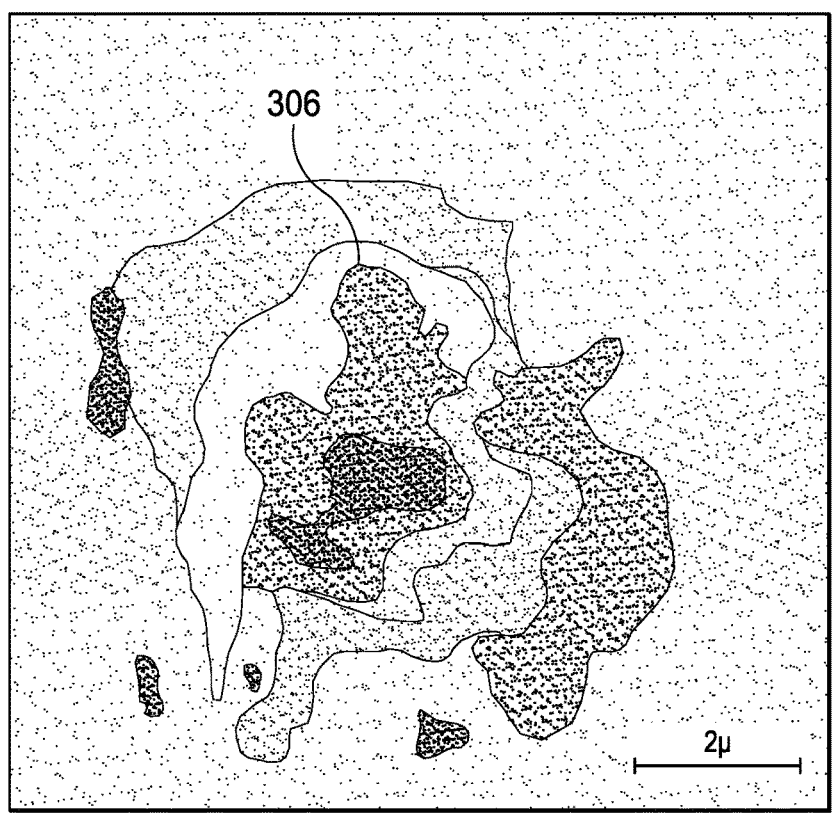
FIG. 3 illustrates a top down depiction of a volcano defect.

As is illustrated in another cross section in FIG. 2C, during the second CVD-W deposition, fluorine from the WF6 used in the CVD-W process reacts with the exposed Ti, forming large irregularly shaped particle defects 204. These defects get buried under the second CVD-W layer 132. FIG. 3 is an illustration showing the appearance of a top down scanning electron microscope (SEM) view of one of these defects 306 (referred to as a volcano defect, due to the visual similarity to a volcano). These defects 306 can be sufficiently large to cause high defect counts on the semiconductor wafer affecting the manufacturing process and causing the integrated circuit die to fail.

Figure 4A:
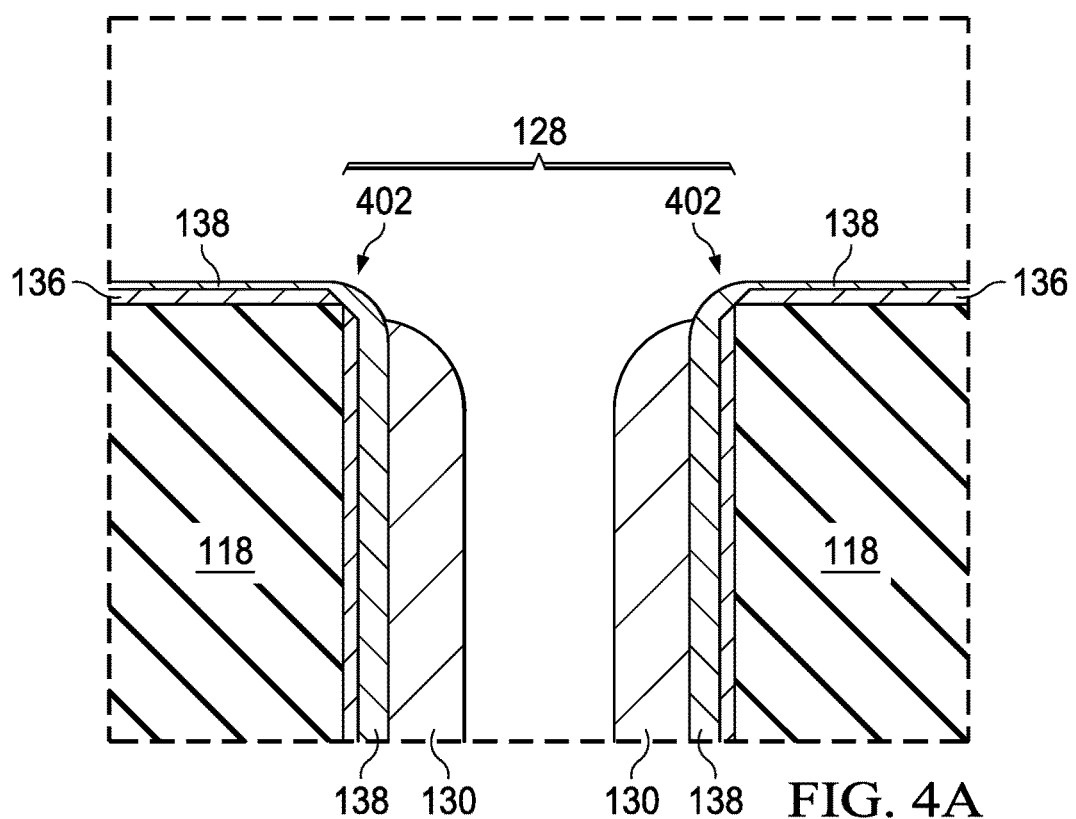
FIGS. 4A and 4B are cross sections of a contact illustrating the conversion of exposed Ti to TiN using a nitrogen anneal.
Figure 4B:
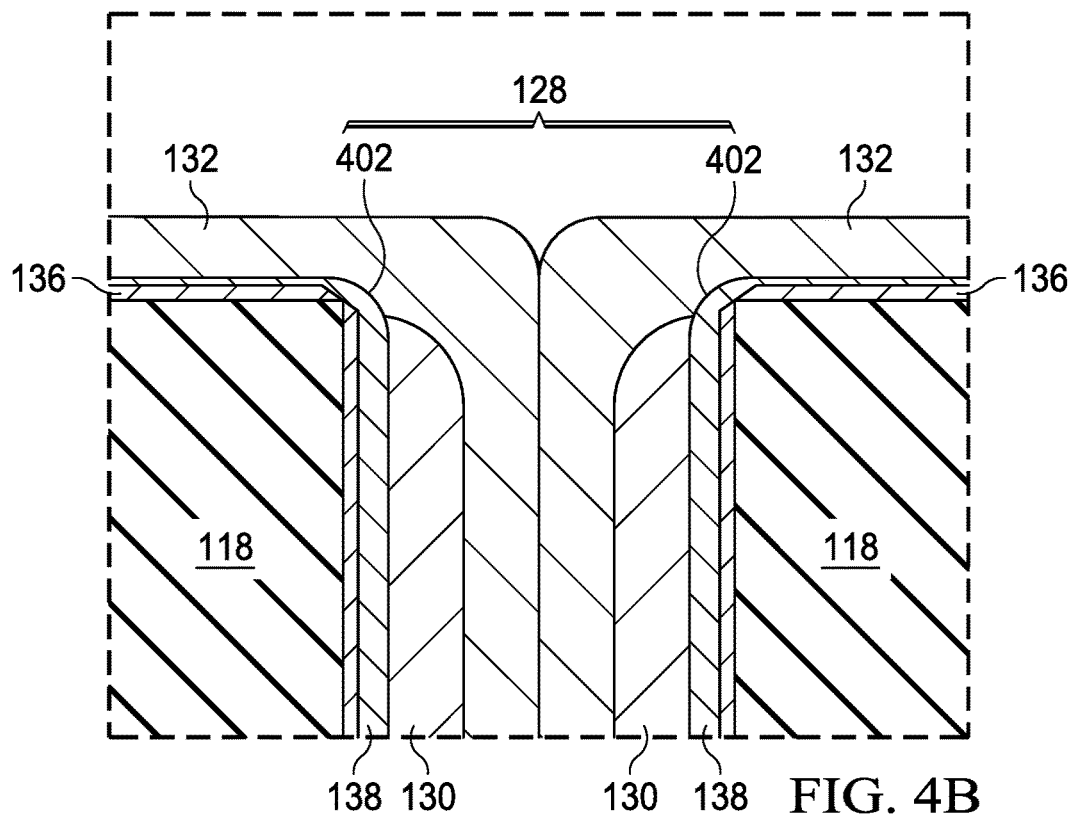

FIGS. 4A and 4B show additional close-up views in cross section. As is illustrated in FIG. 4A, when a nitrogen ($N_2$) anneal with a temperature greater than about 700° C. is performed prior to the second CVD-W layer 132 deposition, exposed Ti (202 in FIG. 2B) is converted to TiN 402. The TiN 402 barrier prevents attack of the underlying Ti layer 130 by fluorine from the WF6 material used in the second CVD-W process. FIG. 4B illustrates in another close up cross section that performing a nitrogen anneal prior to the second CVD-W layer 132 deposition greatly reduces the formation of volcano defects. The nitrogen anneal may be performed with a pressure in the range of 700 to 760 Torr, using a temperature in the range of about 700° C. to 900° C., and for a time in the range of 10 sec. to 60 sec. In an example process the nitrogen anneal was performed at atmospheric pressure for 20 sec. using a rapid thermal anneal with a peak temperature of 775° C.

Figure 5A:
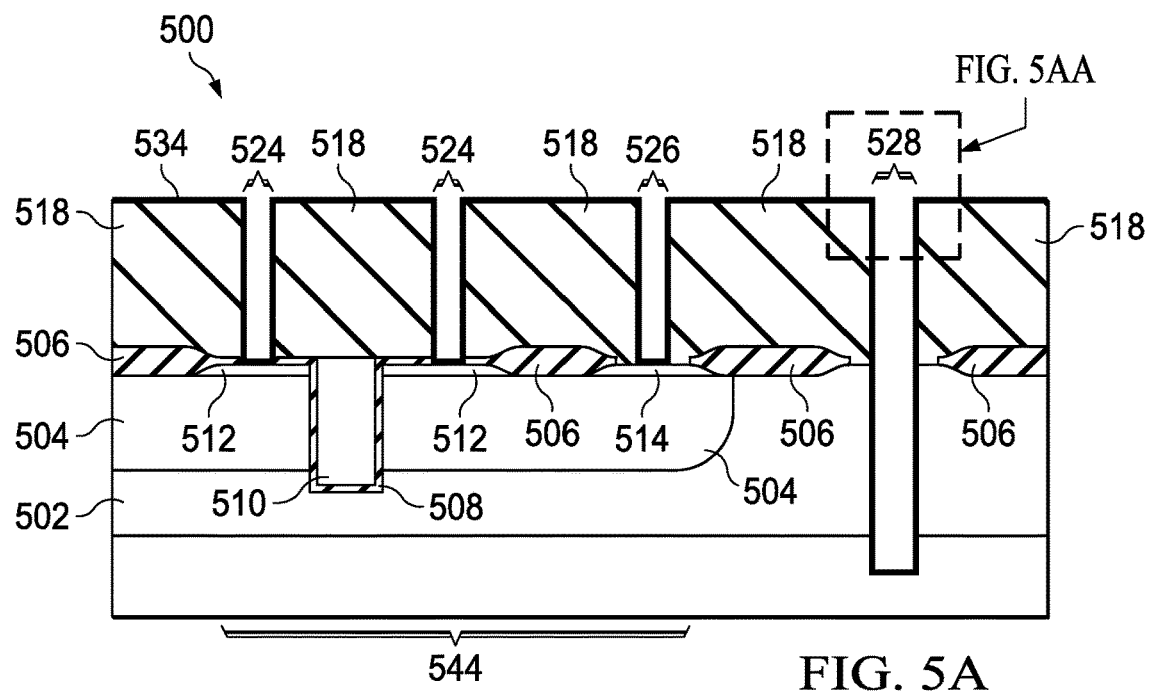
FIGS. 5A through 5E are cross sections of an integrated circuit substrate wafer illustrating the major steps in the formation of a contact using an embodiment process.
Figure 5B:
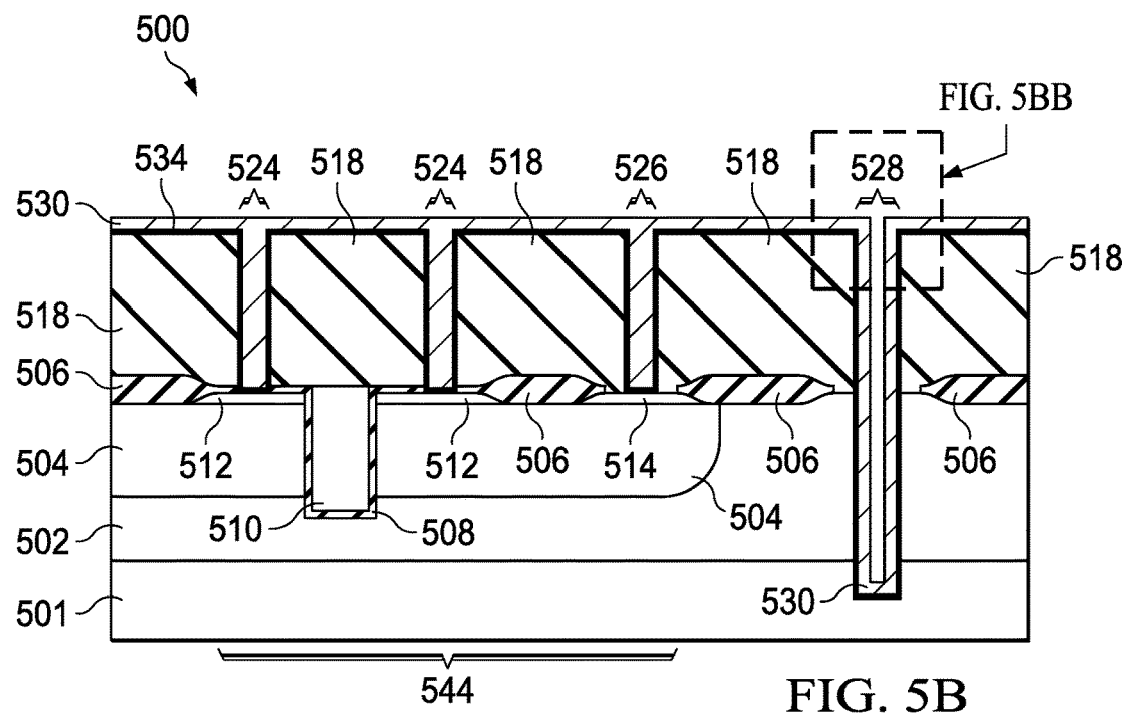
Figure 5B:
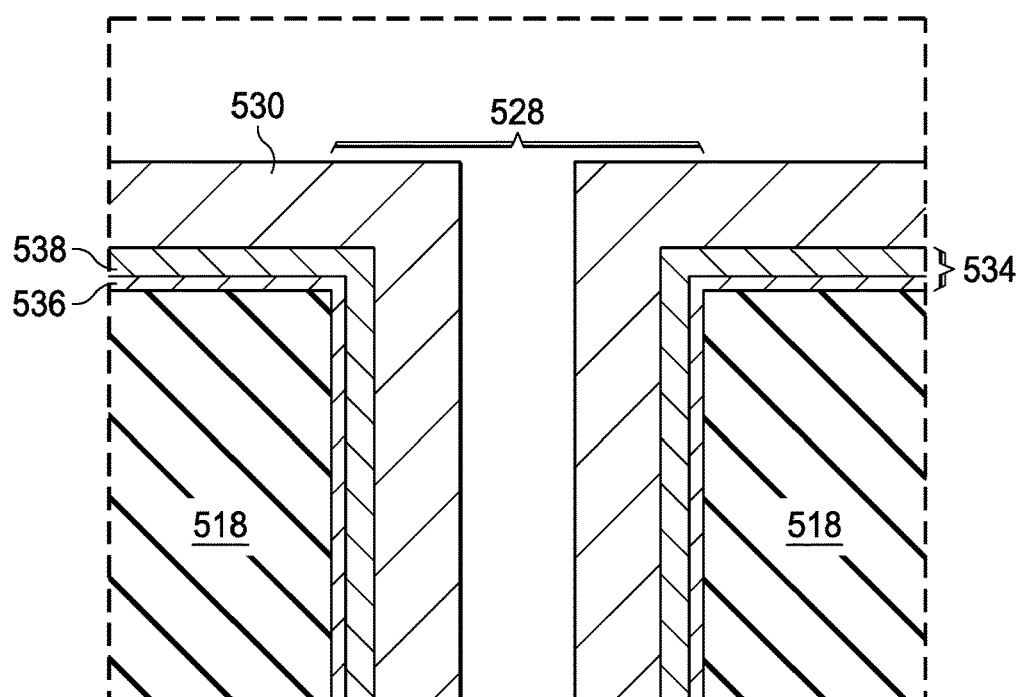
Figure 5C:
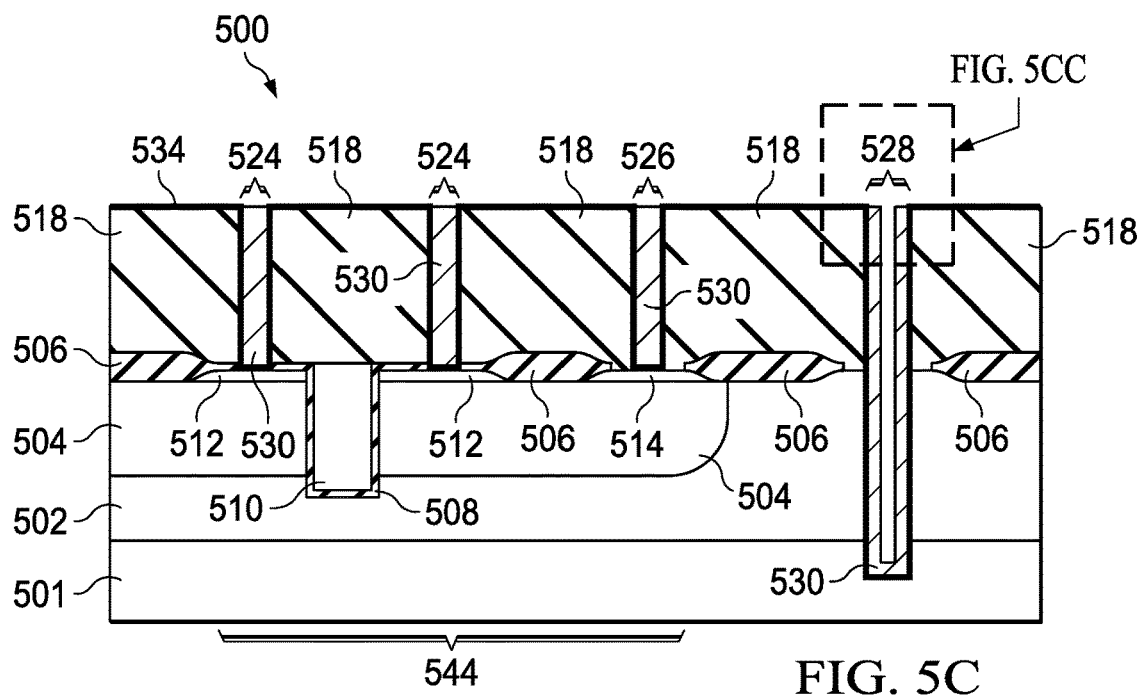
Figure 5C:
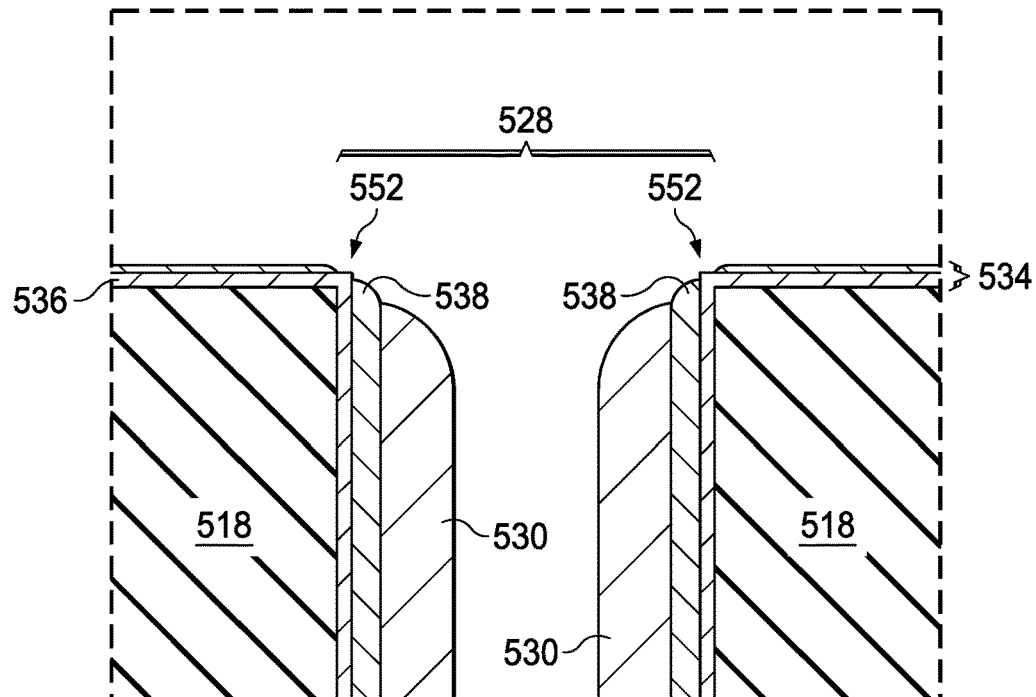
Figure 6:
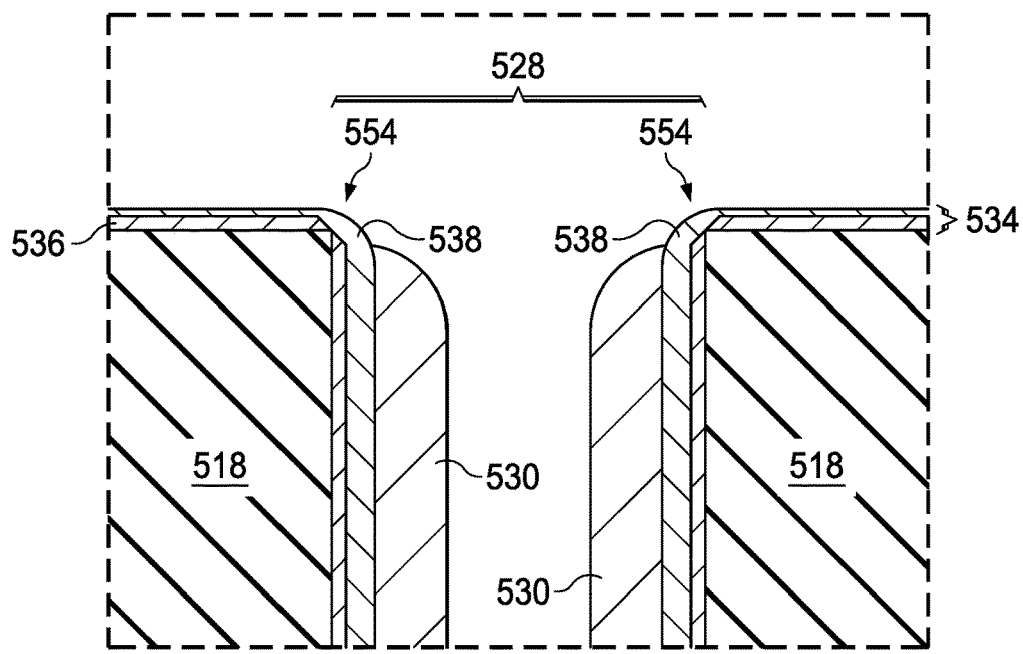
FIG. 6 is a flow diagram for an embodiment method for forming a contact.
Figure 6:
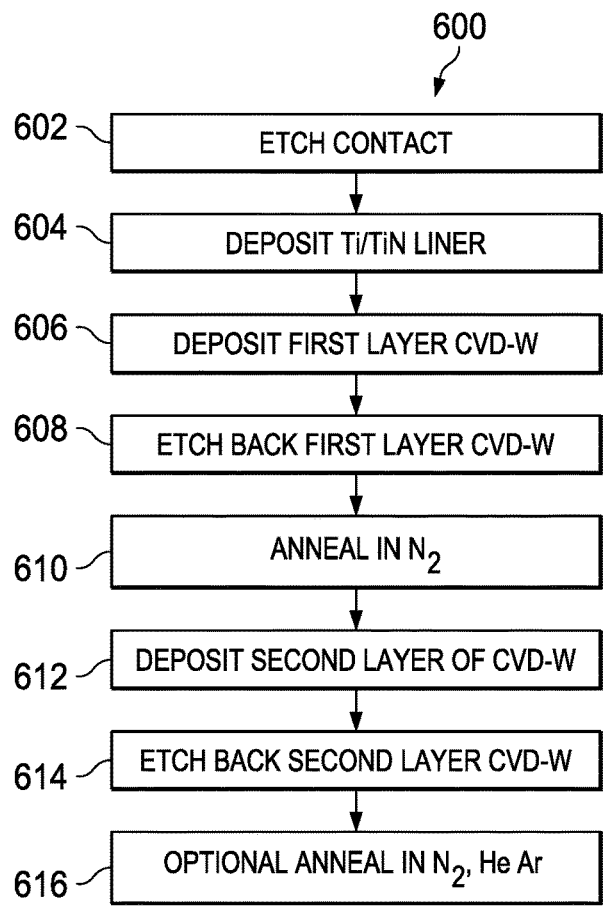

Cross sections in FIGS. 5A through 5E, close up cross sections FIGS. 5AA through 5EE, and the flow diagram in FIG. 6 illustrate a process for forming an embodiment contact 528. FIGS. 5A through 5E are cross sections of a semiconductor substrate 500 for an integrated circuit illustrating the major steps of an embodiment method for forming contacts 528. FIGS. 5AA through 5EE are close up cross sections of the upper corner of a contact 528 during the major steps of an embodiment method for forming contacts 528.

FIG. 5A shows in cross section a partially processed semiconductor wafer 500 in a process that builds the semiconductor device with a low resistance contact similar to that shown in FIG. 1. Reference labels for similar elements in FIG. 5 are similar to the reference labels used for those elements in FIG. 1, for clarity. In FIG. 5, the reference labels start with a first digit of "5", while in FIG. 1, the first digit is "1". For example, contact 528 in FIG. 5 corresponds to contact 128 in FIG. 1. After the contacts 524 to the source and body contact 526 of the vertical high power NMOS transistor 544 are etched, and the trench for contact 528 to the buried diffusion 501 (drain) of the vertical high power NMOS transistor 544 is etched, as shown in a close up cross section in FIG. 5AA (this corresponds to step 602 in FIG. 6), a barrier layer 534 comprised of a Ti layer 536 layer and a TiN layer 538 is deposited on the surface of the semiconductor wafer 500, on the sidewalls and bottom wall of contacts 524 and 526, and on the sidewalls and bottom wall of the contact 528 (this corresponds to step 604 in FIG. 6). The Ti layer 536 can be about 30 to 70 nm thick and the TiN layer 538 can be about 5 to 15 nm thick. Alternative arrangements can be formed using various thicknesses within these ranges.

FIGS. 5B and 5BB show a cross section of semiconductor wafer 500, and a close up cross section of the upper corner of the trench of contact 528, after the first CVD-W layer 530 is deposited (this corresponds to step 606 in FIG. 6). In this illustration the first CVD-W layer 530 fills the contacts to the source 524 and body 526 of the vertical high power NMOS transistor 544 and partially fills the contact 528. In other applications the shallower contacts 524 and 526 which are typically narrower than the contact 528 may completely fill with the first CVD-W layer 530 deposition. In an example, the contacts 524 and 526 are less than a half micron in diameter and the contact 528 is about 0.8 microns in diameter. In this example, the first and second CVD-W layer 530 and 532 depositions are about 600 nm thick.

FIG. 5C shows a cross section of the semiconductor wafer 500 and FIGS. 5CC and 5CCC show close up cross sections of the upper corner of the contact 528 after etch back of the first CVD-W layer 530. The first CVD-W layer 530 is removed from the top horizontal surface of the semiconductor wafer 500 and remains in contacts 524 and 526 and on the sidewalls of the contact 528. In addition, the plasma tungsten etch back over etch removes some of the TiN barrier layer 538. In some instances sufficient TiN may be removed to expose the underlying Ti layer 536.

An $N_2$ anneal at a temperature greater than about 700° C. is then performed (this corresponds to step 610 in FIG. 6) to convert any Ti that may be exposed 552 (FIG. 5CC) during the first etch back of the first CVD-W layer into TiN 554 (FIG. 5CCC). The high temperature anneal can also reduce stress in the CVD-W layer 530. Note that in an alternative embodiment, this anneal can be omitted when it is known that for a particular process, the etch back of the first CVD-W layer does not expose any Ti.

Figure 5D:
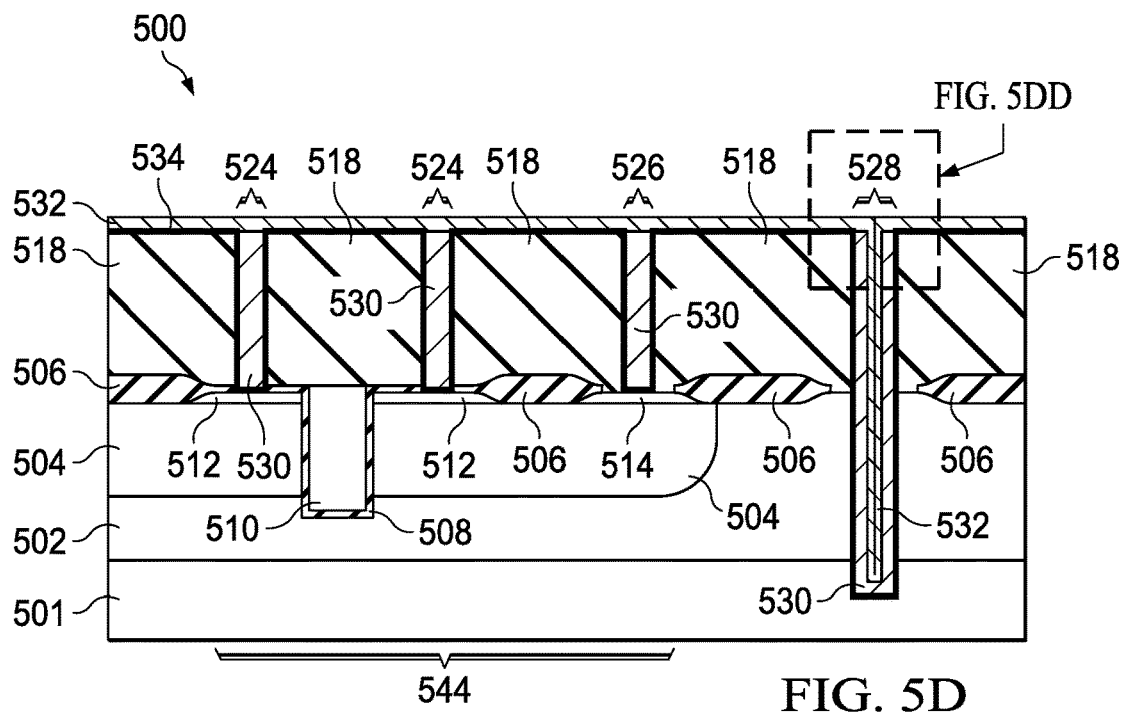
Figure 5D:
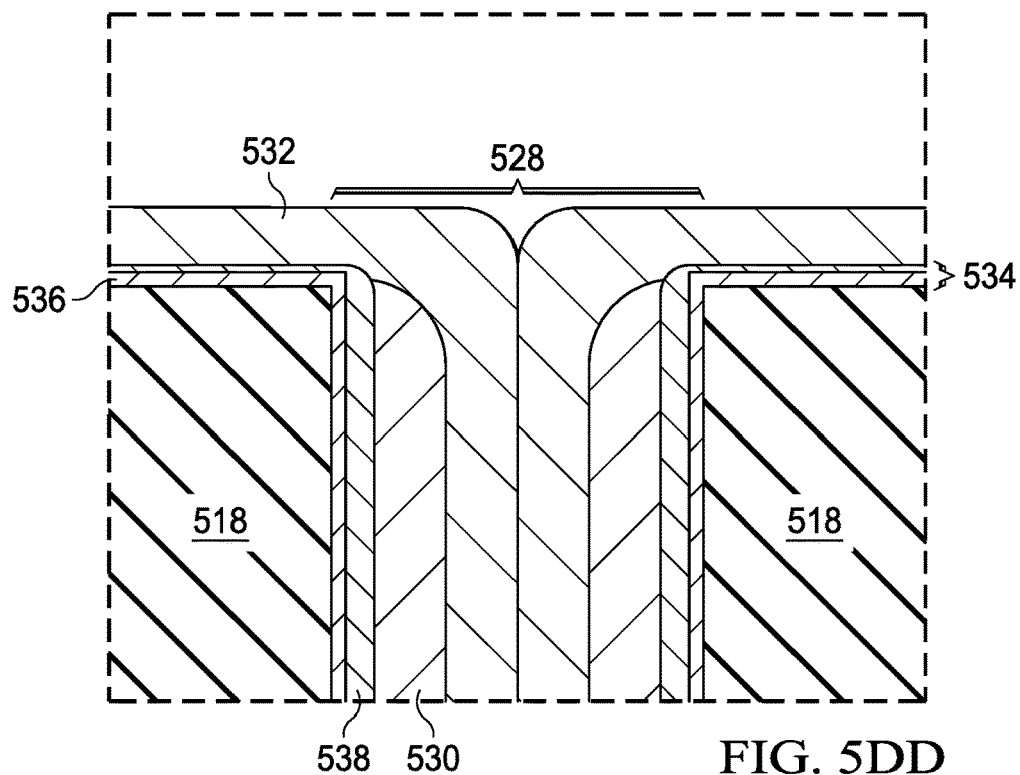

FIGS. 5D and 5DD are a cross section and a close up cross section, respectively, of semiconductor wafer 500 after a second CVD-W layer 532 is deposited covering the surface of the semiconductor wafer 500 and completely filling the contact 528. Because there is no exposed Ti material during the second CVD-W deposition, the WF6 used in the CVD-W deposition does not cause the defects found in prior approaches.

Figure 5E:
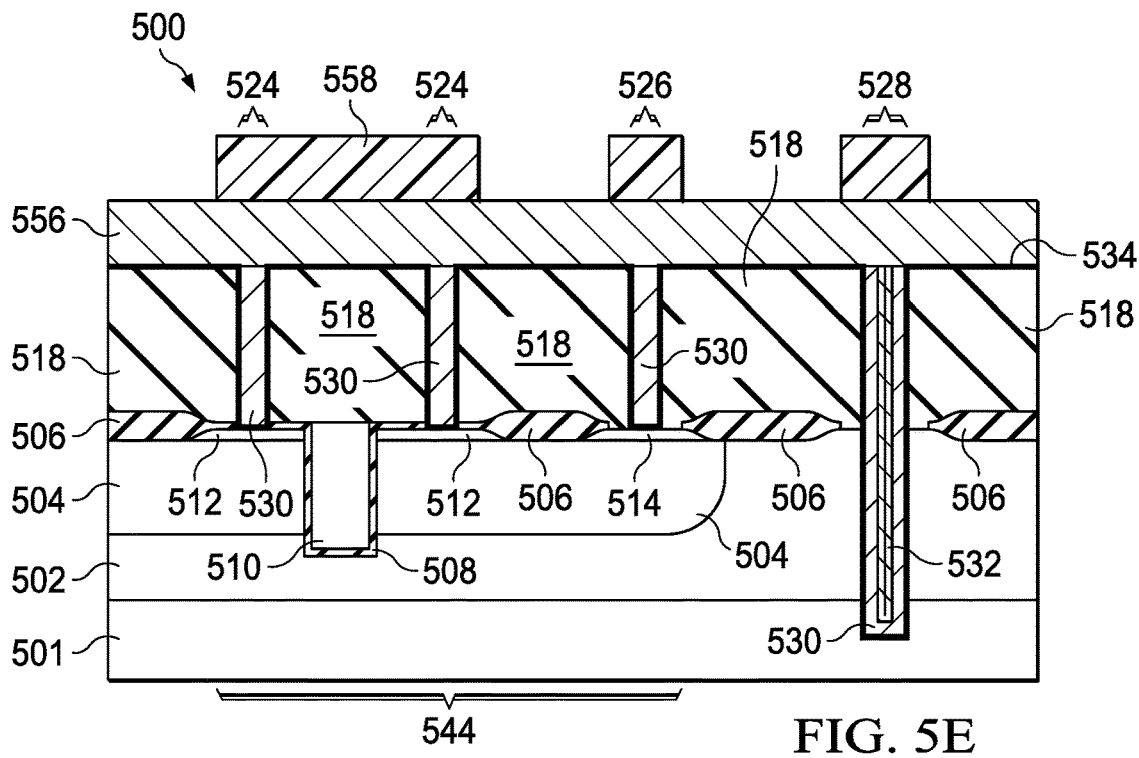
Figure 5E:
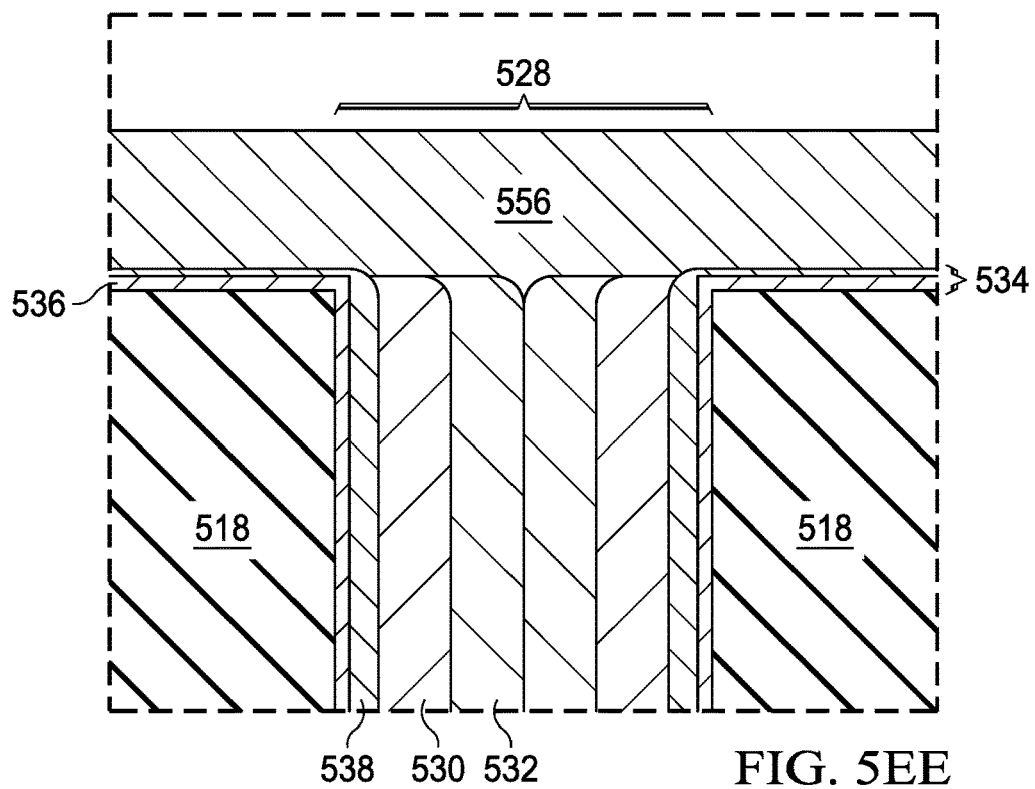

FIGS. 5E and 5EE are a cross section and a close up cross section, respectively, that show the semiconductor wafer 500 after an etch back of the second CVD-W layer 532 removes the second CVD-W layer 532 from the surface of the semiconductor wafer 500, and after a first metal interconnect layer 556 is deposited. Also shown is a first metal interconnect photoresist pattern 558.

Again referring to FIG. 1, FIG. 1 is a cross section that shows a portion of an integrated circuit formed on a semiconductor wafer such as 100 after the first metal interconnect layer 556 (see FIG. 5E) is etched with photoresist pattern 558 (see FIG. 5E) to form interconnect geometries 138 and 140 to the source 124 and body contacts 126, and interconnect geometry 142 to the contact 128 which is coupled to the low resistance buried layer 101 (drain) of the vertical high power NMOS transistor 144.

In the illustrative examples described hereinabove, two CVD-W layer depositions are used to illustrate the embodiments. In alternative embodiments, more CVD-W layer depositions can be used to keep the thickness of each CVD-W layer below about 700 nm. If more than two CVD-W depositions are employed, an optional stress relaxation anneal may be performed in an inert atmosphere such as: nitrogen; helium; and argon. In an embodiment, this relaxation anneal can be performed after the additional individual CVD-W layers are deposited and etched back, while in an alternative arrangement, the relaxation anneals can be performed after some or after all of the CVD-W layers are formed.

FIG. 6 is a flow diagram for a method embodiment 600. In FIG. 6, the method begins at step 602, in which the trench for the contact is etched into the semiconductor wafer. In step 604, a liner is deposited including titanium or titanium nitride, and the liner can include both titanium and titanium nitride. In step 606, a first layer of CVD-W is deposited over the semiconductor wafer and into the contact, at least partially filling the contact. In step 608, an etch process is performed to etch back the CVD-W layer deposited in step 606; and the process continues.

At step 610, an anneal in nitrogen is performed to convert any exposed Ti to TiN. In an alternative embodiment where it is known that the etch back of step 608 does not expose any Ti, this anneal in step 610 can be omitted.

At step 612, a second layer of CVD-W is deposited. As is described hereinabove, in alternative embodiments that are also contemplated, the number of CVD-W layers deposited can be increased to three, four or more depending on the size of the contact and the application. In the embodiments, the thickness of the deposited CVD-W layers is less than about 700 nanometers, which has been found to reduce stress on the wafer, and reducing wafer warpage that affects subsequent processing steps, increasing yield.

At step 614 the CVD-W layers are etched back after deposition removing the CVD-W layers from the surface of the semiconductor substrate. The embodiment process limits the CVD-W layer thickness on the semiconductor substrate to 700 nm or less, preventing stress from building up on the semiconductor substrate.

In step 616, optional relaxation anneal steps can be performed following any of the CVD-W depositions and etch backs and in some examples, between the CVD-W depositions. Use of the relaxation anneals reduces defects that can otherwise occur.

Use of the embodiments reduces defects and reduces stress on the semiconductor wafer. The embodiments use existing process steps and no modification to process equipment or chemistry are needed to use the embodiments.

Modifications are possible in the described embodiments, and other embodiments are possible within the scope of the claims.

What is claimed is:

1. A device, comprising:
   a semiconductor substrate;
   a buried layer; and
   a trench with inner walls extending from the buried layer to a surface of the semiconductor substrate, the trench having sidewalls, a bottom wall, a barrier layer including a titanium (Ti) layer covering the sidewalls and the bottom wall, and a filler including more than one layer of conductor material formed on the barrier layer.

2. The device of claim 1, in which the more than one layer of conductor material includes a first chemical vapor deposited tungsten (CVD-W) layer, and a second CVD-W layer on the first CVD-W layer.

3. The device of claim 1, in which the trench is filled with a first CVD-W layer, a second layer CVD-W layer, and a third CVD-W.

4. The device of claim 2, in which a thickness of the more than one layer of conductor material of CVD-W is equal to or less than about 700 nm.

5. The device of claim 1, in which the trench forms a sinker contact that is round and has a diameter greater than about 0.8 microns.

6. The device of claim 1, in which the barrier layer includes a titanium nitride (TiN) layer above the Ti layer.

7. The device of claim 6 in which the TiN layer includes a portion positioned at an opening of the trench at the substrate surface.

8. The device of claim 1, in which the buried layer includes an n-type drain region of a vertical NMOS transistor.

9. The device of claim 1, in which the buried layer includes an n-type collector region of a vertical NPN bipolar transistor.

10. The device of claim 1, in which the buried layer is p-type and is a drain of a vertical PMOS transistor.

11. The device of claim 1, in which the buried layer is p-type and is a collector of a vertical PNP bipolar transistor.

12. A device, comprising:
    a semiconductor substrate;
    a buried layer of a first conductivity type;
    a first region of the first conductivity type over the buried layer;
    a second region of a second conductivity type in the first region;
    a third region of the first conductivity type at a surface of the second region;
    a gate trench extending through the second region;
    a source contact to the third region; and
    a trench with walls extending from the buried layer to a surface of the semiconductor substrate, the trench having sidewalls, a bottom wall, a barrier layer including a titanium nitride (TiN) layer covering the sidewalls and the bottom wall, and a filler including more than one layer of conductor material formed on the barrier layer.

13. The device of claim 12, wherein the more than one layer of conductor material includes a first tungsten layer and a second tungsten layer on the first tungsten layer.

14. The device of claim 12, wherein the trench is filled with a first tungsten layer, a second layer tungsten layer, and a third tungsten layer.

15. The device of claim 12, wherein the trench forms a sinker contact that is round and has a diameter greater than about 0.8 microns.

16. The device of claim 12, wherein the barrier layer includes a titanium (Ti) layer under the TiN layer.

17. The device of claim 16, wherein a portion of the Ti layer at an opening of the trench at the substrate surface is converted to TiN.

* * * * *